United States Patent
Lee et al.

(10) Patent No.: US 7,262,427 B2
(45) Date of Patent: Aug. 28, 2007

(54) STRUCTURE FOR PHASE CHANGE MEMORY AND THE METHOD OF FORMING SAME

(75) Inventors: Ming Hsiu Lee, Hsinchu (TW); Yi Chou Chen, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/966,335

(22) Filed: Oct. 15, 2004

(65) Prior Publication Data

US 2005/0173691 A1   Aug. 11, 2005

Related U.S. Application Data

(60) Provisional application No. 60/543,308, filed on Feb. 9, 2004.

(51) Int. Cl.
*H01L 29/04* (2006.01)

(52) U.S. Cl. .................................. 257/3; 257/2; 257/5

(58) Field of Classification Search .................... 257/1, 257/2, 3, 4, 5
See application file for complete search history.

(56) References Cited

U.S. PATENT DOCUMENTS

| | | | |
|---|---|---|---|
| 6,031,287 A | 2/2000 | Harshfield | |
| 6,111,264 A | 8/2000 | Wolstenholme et al. | |
| 6,114,713 A | 9/2000 | Zahorik | |
| 2005/0032319 A1* | 2/2005 | Dodge | ........................ 438/293 |

* cited by examiner

*Primary Examiner*—Sara Crane
(74) *Attorney, Agent, or Firm*—Martine Penilla & Gencarella, LLP

(57) ABSTRACT

A phase change device includes a first contact electrode structure a phase change material and a first insulating material between the phase change material and the first contact electrode structure and a second contact electrode in contact with the phase change material. A contact structure formed in the first insulating material between the first contact electrode structure and the phase change material is also included. The contact structure is formed by an insulating material breakdown process. A method of forming a phase change device is also described.

29 Claims, 14 Drawing Sheets

US 7,262,427 B2

STRUCTURE FOR PHASE CHANGE MEMORY AND THE METHOD OF FORMING SAME

CROSS REFERENCE TO RELATED APPLICATIONS

This application claims priority under 35 U.S.C. § 119(e) from U.S. Provisional Patent Application No. 60/543,308, filed on Feb. 9, 2004, the disclosure of which is incorporated herein by reference in its entirety.

BACKGROUND OF THE INVENTION

1. Field of the Invention

The present invention relates generally to memory systems, and more particularly, to methods, systems and apparatus for phase change memory cells.

2. Description of the Related Art

The general concept of utilizing electrically writable and erasable phase change materials (i.e., materials that can be electrically switched between generally amorphous and generally crystalline states) for electronic memory applications is well known in the art. A typical phase change material is a material that has two general states: a generally amorphous state and a generally crystalline state. The phase change material can include one or more chalcogenide compounds that at least partly include one or more of the following materials: Te, Se, Sb, Ni, and Ge and various combinations thereof. The typical phase change material can be switched from one state to the other by passing an electrical current through the phase change material to cause it to change states. Typically in the first state (e.g., amorphous state), the phase change material has a relatively high resistance and in the second state (e.g., the crystalline state), the phase change material has a relatively low resistance. As the state of the phase change material can only be changed by application of energy, then the phase change material is generally non-volatile in that it does not require energy to maintain it's current state. Further, because the resistance of the phase change material varies with the state, then the phase change material can be reliably used to store binary data such as may be used for a memory cell in a computer or other binary data storage usage.

A traditional phase change memory cell structure includes a transistor or diode as a steering element, in series with the phase change memory element. FIG. 1A shows a prior art phase change memory cell array 100. Four memory cells 110A-110D are included in the memory cell array 100. Each memory cell 110A includes a transistor 102, as a steering element, and one phase change device 104 as a memory element. FIG. 1B shows another prior art phase change memory cell array 150. Four memory cells 160A-160D are included in the memory cell array 150. A diode 152 is used as the steering element instead of the transistor 102. The need of a steering element increases the overall size, cost, complexity and power consumption of a phase change memory cell.

A generally small contact structure at one end of the phase change device 104 is typically preferred. A smaller contact structure can yield a smaller overall device size, thereby allowing a more densely packed integrated circuit of such phase change memory cells. More importantly, however, a smaller contact area can also yield a lower switching current and consequently a lower overall switching power consumption. However, the manufacturing processes required to form such a small contact structure is very complicated and therefore has a relatively high process cost.

In view of the foregoing, there is a need for a simpler, smaller, more power efficient and more easily manufactured phase change device that can be more efficiently used such as in a phase change memory cell.

SUMMARY OF THE INVENTION

Broadly speaking, the present invention fills these needs by providing an improved and simplified phase change device and the methods for manufacturing the improved and simplified phase change device. It should be appreciated that the present invention can be implemented in numerous ways, including as a process, an apparatus, a system, computer readable media, or a device. Several inventive embodiments of the present invention are described below.

One embodiment provides a phase change device that includes a first contact electrode structure a phase change material and a first insulating material between the phase change material and the first contact electrode structure and a second contact electrode in contact with the phase change material. A contact structure formed in the first insulating material between the first contact electrode structure and the phase change material is also included. The contact structure is formed by an insulating material breakdown process.

The first insulating material can be formed on top of the first contact electrode structure and the phase change material can be formed on top of the first insulating material and the second contact electrode structure can be formed on top of the phase change material. Alternatively, the phase change material formed on top of the first contact electrode structure and the first insulating material can be formed on top of the phase change material and the second contact electrode structure can be formed on top of the first insulating material.

The first contact electrode structure can include one or more layers of materials such as silicon, aluminum alloy, carbon, tungsten, copper, titanium, or titanium nitride (TiN). The second contact electrode structure can include one or more layers of materials such as silicon, aluminum alloy, carbon, tungsten, copper, titanium, or titanium nitride (TiN). The first contact electrode structure can include a plug structure. The second contact electrode structure can include a plug structure. The first contact electrode structure can include one or more layers. The second contact electrode structure can include one or more layers.

The first insulating material can include an oxide. In particular, the first insulating material can include at least one of $SiO_2$, $Al_2O_3$, silicon nitride ($Si_3N_4$), or SiON.

The phase change device can also include a second insulating material around at least one of the first contact electrode structure and the second contact electrode structure. The second insulating material can include an oxide. Alternatively, the second insulating material can include at least one of $SiO_2$, $Al_2O_3$, silicon nitride ($Si_3N_4$), or SiON.

The phase change material can include a chalcogenide material. The phase change material can include Te, Se, Sb, Ni, Ge, Ag and combinations thereof. The phase change material has a thickness of between about 1 nm to about 100 nm.

The first contact electrode structure has a thickness of about 10 nm to about 1000 nm. The second contact electrode structure has a thickness of about 10 nm to about 1000 nm. The first insulating layer has a thickness of about 1 nm to about 30 nm. The contact has a size of about 1 nm to about 1000 nm. The first contact electrode structure can include a bit line structure or a contact plug structure. The second contact electrode structure can include a word line structure or a contact plug structure.

The phase change device can also include multiple bit line structures and multiple word line structures arranged to form an array. The array includes multiple overlap points. A layer of the first insulating material and a layer the phase change material separate each of the bit line structures and each of the word line structures at each of the overlap points. Each of the overlap points includes a corresponding contact structure through the layer of the first insulating material.

Another embodiment includes a phase change memory cell. The phase change memory cell includes a bit line structure with a first insulating material on top of the bit line structure. A phase change material is on top of the first insulating material and a word line structure is on top of the phase change material. A contact structure that is formed in the first insulating material between the bit line structure and the phase change material. The contact structure being formed by an insulating material breakdown process.

Yet another embodiment provides a method of forming a phase change device. The method includes forming a sandwich structure that includes a first contact electrode structure, a layer of a phase change material, a layer of a first insulating material between the first contact electrode structure and the layer of the phase change material and a second contact electrode structure in contact with the layer of the phase change material. The method also includes forming a contact structure through the first insulating material at a selected point where the first contact electrode structure and the second contact electrode structure overlap, wherein the contact structure is formed by an insulating material breakdown process.

The first contact electrode structure can include forming a first conductive layer on a substrate removing a portion of the first conductive layer to form the first contact electrode structure and filling the removed portion of the first conductive layer with a second insulating material.

Forming the second contact electrode structure can include forming a second conductive layer on top of the layer of the phase change material and removing a portion of the second conductive layer to form the second contact electrode structure.

Removing the portion of the second conductive layer to form the second contact electrode structure can include removing a portion of the phase change material. The insulating material breakdown process can include applying at least one of a constant current, a constant voltage, a stepping current or a stepping voltage to the first contact electrode structure and the second contact electrode structure.

Another embodiment provides a phase change device that includes a first contact electrode structure and a phase change material formed on top of the first contact electrode structure. A first insulating material is formed on top of the phase change material and a second contact electrode structure is formed on top of the first insulating material. A contact structure is formed in the first insulating material between the second contact electrode structure and the phase change material. The contact structure is formed by an insulating material breakdown process.

The present invention reduces the manufacturing cost of phase change memory cells due to the simplified structure. Further, the operating current can be reduced due to the small contact size that can also provide a low power consumption phase change memory cell or other phase change devices.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for an improved phase change device and phase change memory cell will now be described. It will be apparent to those skilled in the art that the present invention may be practiced without some or all of the specific details set forth herein.

Phase change memory cells are very fast and nonvolatile. Therefore, phase change memory cells can be an excellent choice for a next generation data storage (i.e., memory). The present invention describes an improved phase change memory cell structure and a method for manufacturing the improved phase change memory cell. The disclosed phase change memory cell is more power efficient than that described in the prior art.

In one embodiment, the phase change contact size is reduced to a minimum size so as to reduce the drive current while maintaining a sufficient current density. The minimum contact size is limited by the fabrication techniques, and the cost to fabricate the small contact is very high.

The disclosed new phase change memory cell structure includes a sandwich structure of conductor/phase change material/insulator/conductor, where the memory cell is formed at the intersection of the two conductors. The insulator can be an oxide or other suitable insulator.

A small contact can be formed by an insulator breakdown process. In this manner, controlling the insulator breakdown condition can minimize the contact size. The insulator also provides an insulator for the non-programmed cell, which can both block the leakage path for a fresh array and increase the sensing margin in a one time programming (OTP) application.

Figure 2:
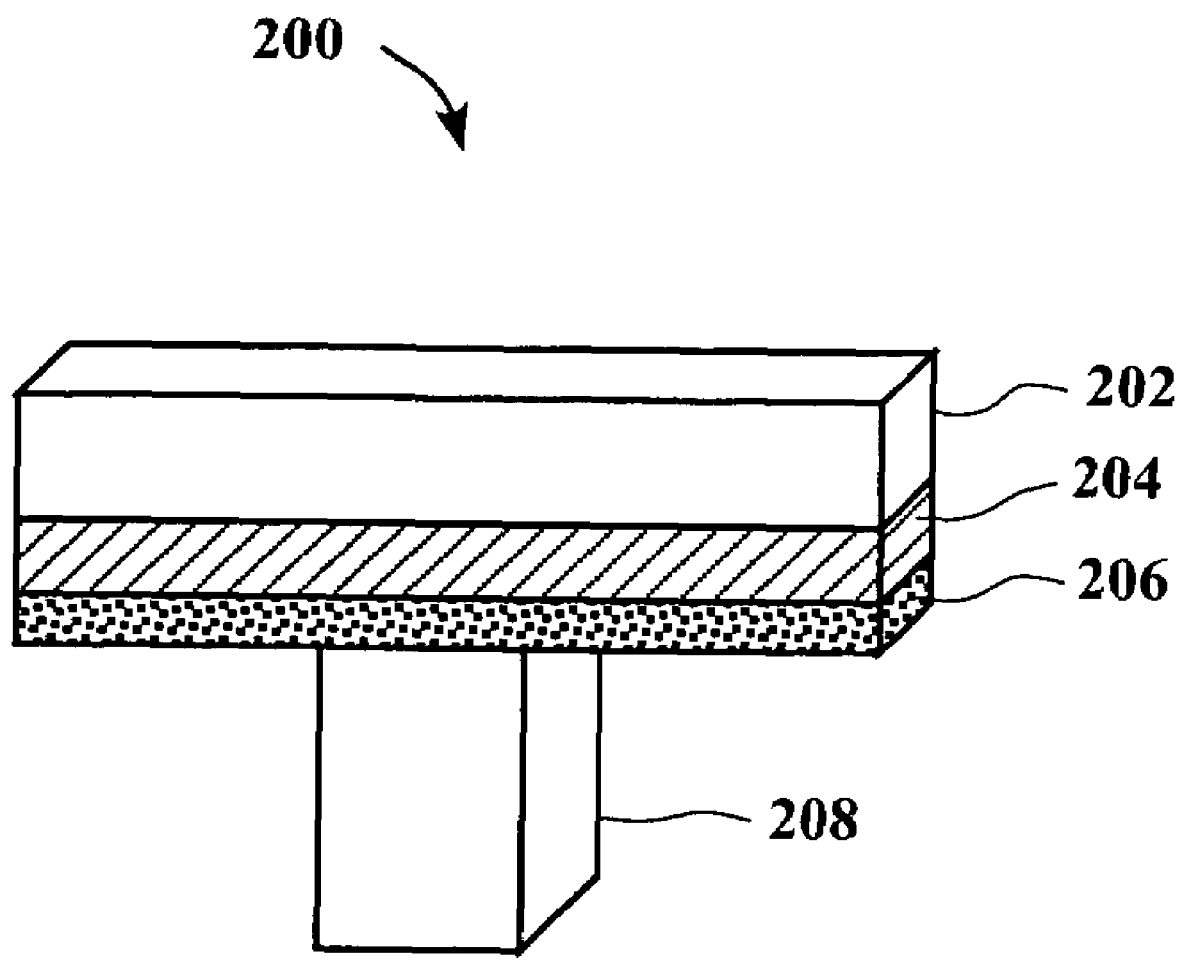
FIG. 2 shows a phase change memory device as a sandwich structure, in accordance with one embodiment of the present invention.

FIG. 2 shows a phase change memory device as a sandwich structure 200, in accordance with one embodiment of the present invention. The sandwich structure 200 includes a first conductor 202, a phase change material 204, an insulator 206 and a second conductor 208. The conductors 202, 208 can be one or more layers of silicon, tungsten, or other suitable metals (e.g., Cu, Ti, etc.), combinations of multiple metals, or other suitable conductive materials (e.g., titanium nitride, carbon). The conductors 202, 208 should be able to sustain a high temperature operation without melting. The conductor 208 can be formed as a contact plug or via plug through conventional methods. The phase change memory device can be used in combination with a prior art steering element (e.g., transistor 102, diode 152). The thickness of the conductors 202, 208 can be within a range of from about 10 nanometer (nm) to about 1000 nm.

The insulator 206 can be $SiO_2$, $Al_2O_3$, silicon nitride ($Si_3N_4$), or SiON, or any other suitable insulator material. The insulator 206 should have known properties including the electrical field to breakdown, insulator reliability, thermal stability, adhesion property to adjacent layers 204, 208, etc. The operating conditions (e.g., drive current required and minimum read current, etc.) of the resulting memory cell 200 are at least partially dependant the selected insulator material composition and thickness. The insulator 206 can have a thickness of between about 1 nm and about 30 nm. The phase change 204 can have a thickness of between about 1 nm and about 100 nm.

It should be understood that the sandwich structure 200 can be formed with the first insulating material formed on top of the first contact electrode structure, the phase change material formed on top of the first insulating material and the second contact electrode structure formed on top of the phase change material. Alternatively, the sandwich structure 200 can be formed with the phase change material formed on top of the first contact electrode structure, the first insulating material formed on top of the phase change material and the second contact electrode structure formed on top of the first insulating material.

Figure 3:
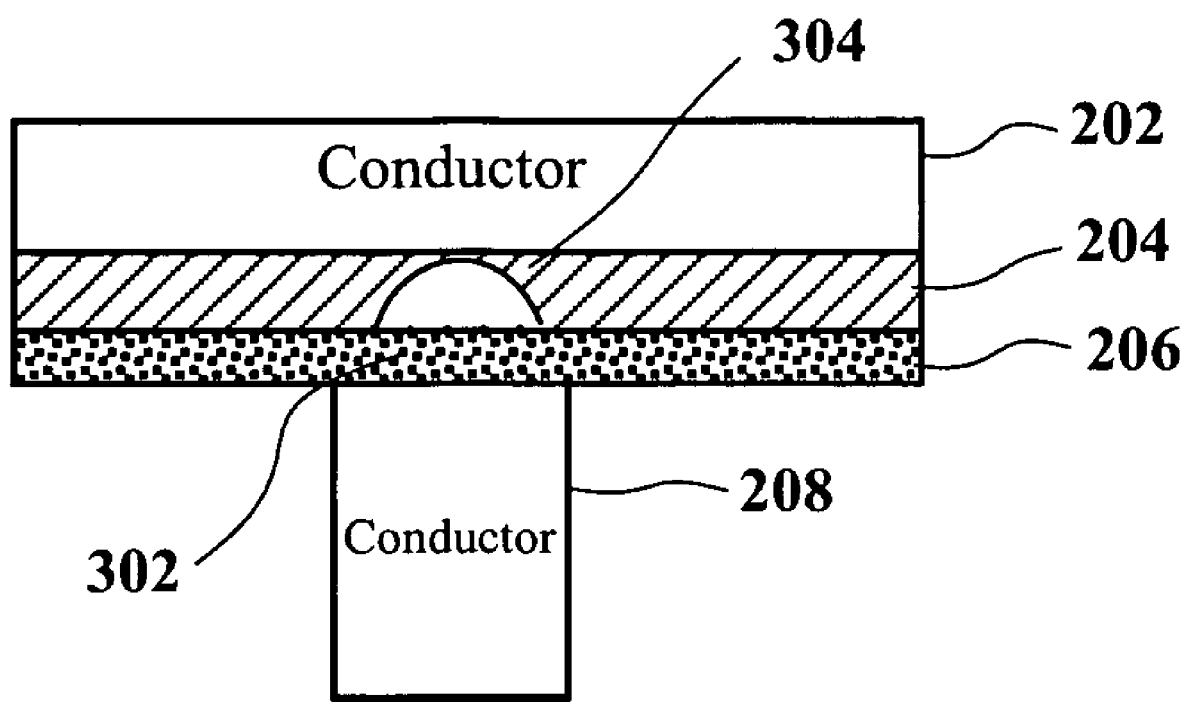
FIG. 3 shows a relatively small contact formed by an oxide breakdown process, in accordance with one embodiment of the present invention.

FIG. 3 shows a relatively small contact 302 formed by an insulator breakdown process, in accordance with one embodiment of the present invention. The small contact 302 can be about 1 nm to about 1000 nm. The size of the contact 302 is determined by the breakdown condition. By way of example, a product specification can define a desired maximum drive current and/or a desired minimum read current. The specified maximum drive current and/or a minimum read current will determine the desired size of the small contact 302.

The actual size of the small contact 302 is determined by the insulator breakdown process parameters (e.g., current, voltage, time, etc.). In an exemplary insulator breakdown process a 10V bias can be applied to a 6.5 nm thick silicon dioxide ($SiO_2$) insulation layer. The $SiO_2$ insulation layer will breakdown and a small contact 302 will be formed. Increasing or decreasing the thickness of the insulation layer can require greater or less bias voltage and/or current for an equivalent insulator breakdown to occur. Further, an insulation layer material other than $SiO_2$ can require different bias voltage and or current for an equivalent insulator breakdown to occur. The breakdown procedure can be accomplished in a constant current mode, a constant voltage mode, a stepping current mode, a stepping voltage mode or other suitable processes. The small contact size allows a small operation current to be used while ensuring a sufficient current density at the contact area to cause the phase change material 204 to change states.

Figure 4:
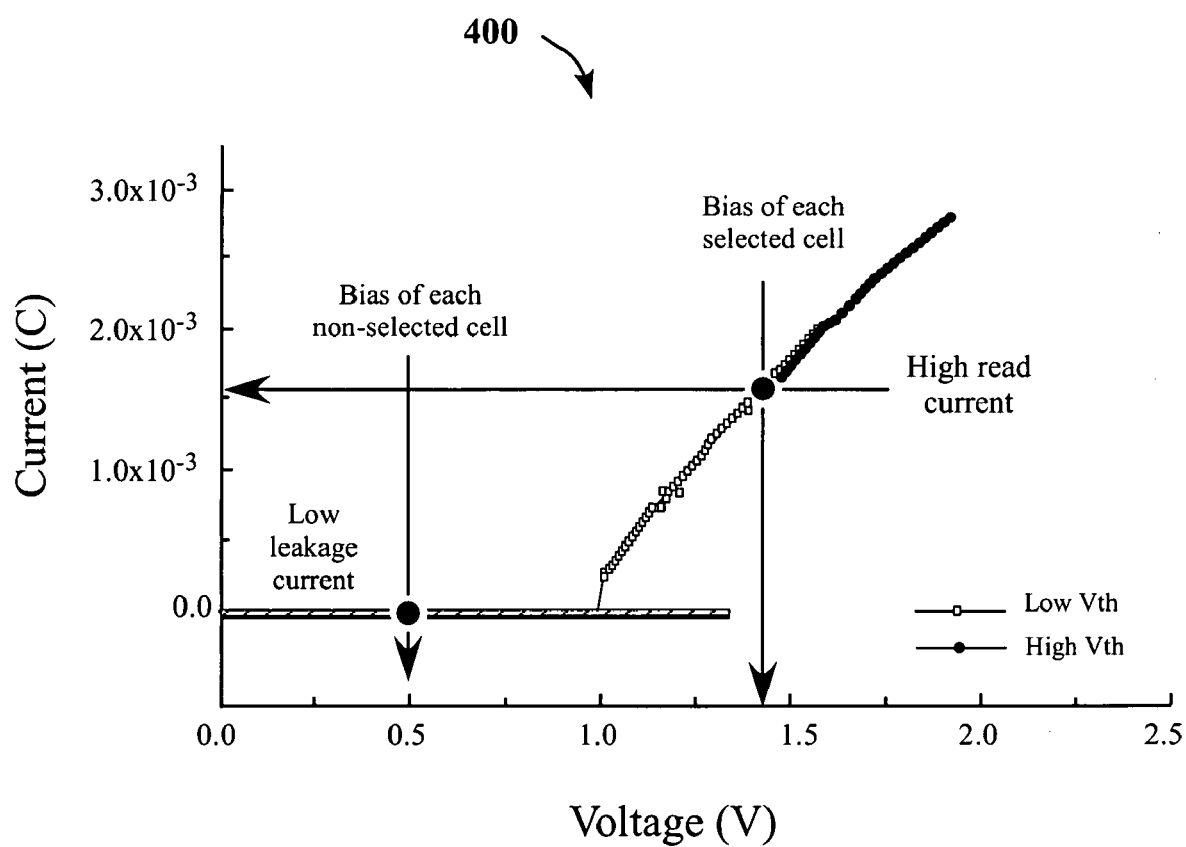
FIG. 4 is a graph of the non-linear current (I) and voltage (V) characteristics of a phase change memory cell, in accordance with one embodiment of the present invention.
Figure 5:
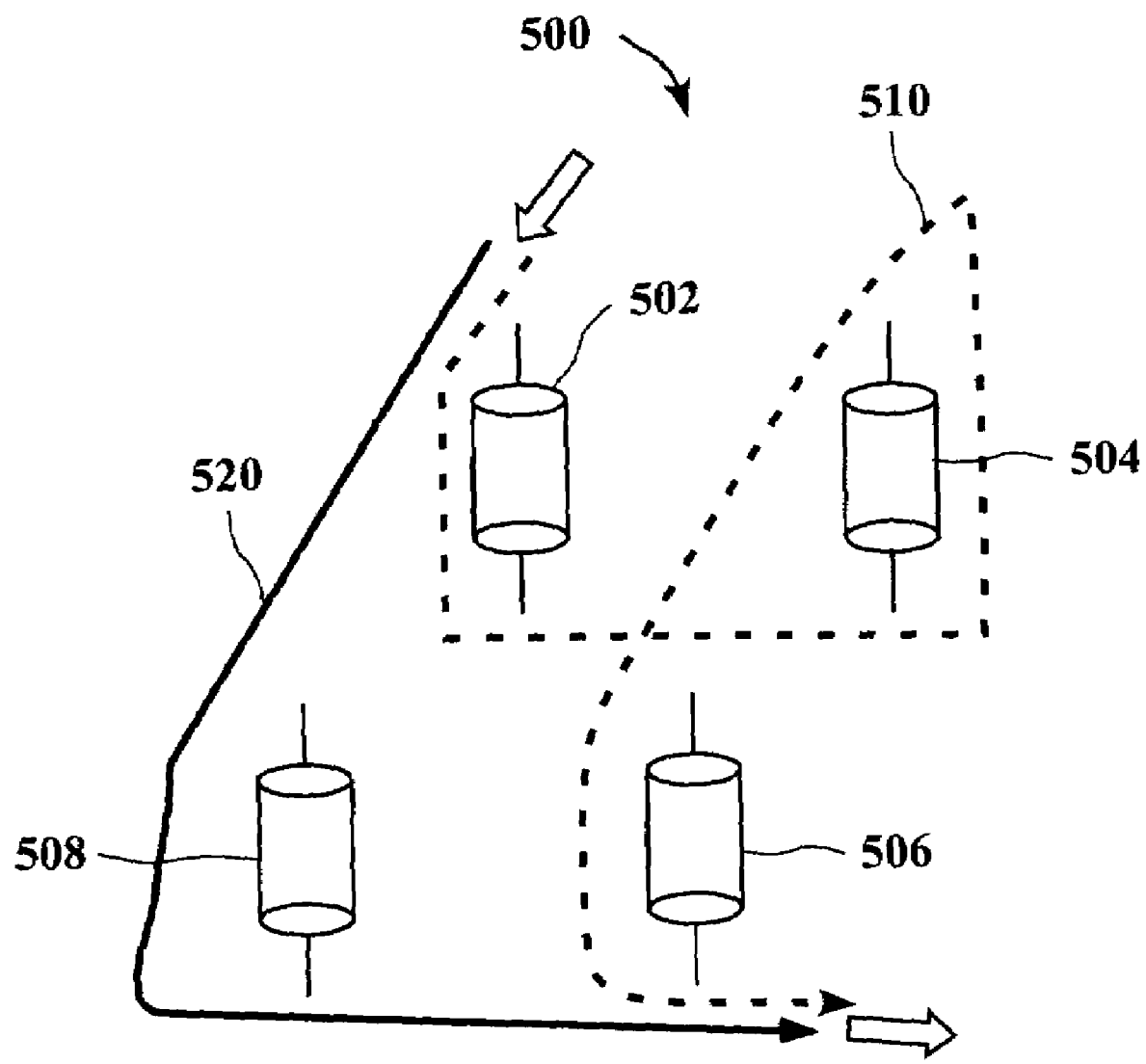
FIG. 5 is a block diagram of four phase change memory cells, in accordance with one embodiment of the present invention.

FIG. 4 is a graph 400 of the non-linear current (I) and voltage (V) characteristics of a phase change memory cell, in accordance with one embodiment of the present invention. FIG. 5 is a block diagram 500 of four, phase change memory cells, in accordance with one embodiment of the present invention. Three phase change memory cells 502, 504 and 506 are not selected. The phase change memory cells 502, 504 and 506 are non-selected because they each have a bias voltage less than the turn on voltage. The non-selected phase change memory cells 502, 504 and 506 have a low leakage current (e.g., less than about 0.1 ma as shown in FIG. 4) along a leakage current path 510. The leakage current path flows serially through cells 502, 504 and 506.

A fourth phase change memory cell 508 has a bias voltage sufficient to turn on the phase change memory cell 508 and is therefore selected. The current conducted through the selected phase change memory cell 508 is about 1.6 mA (as shown in FIG. 4).

Figure 1A:
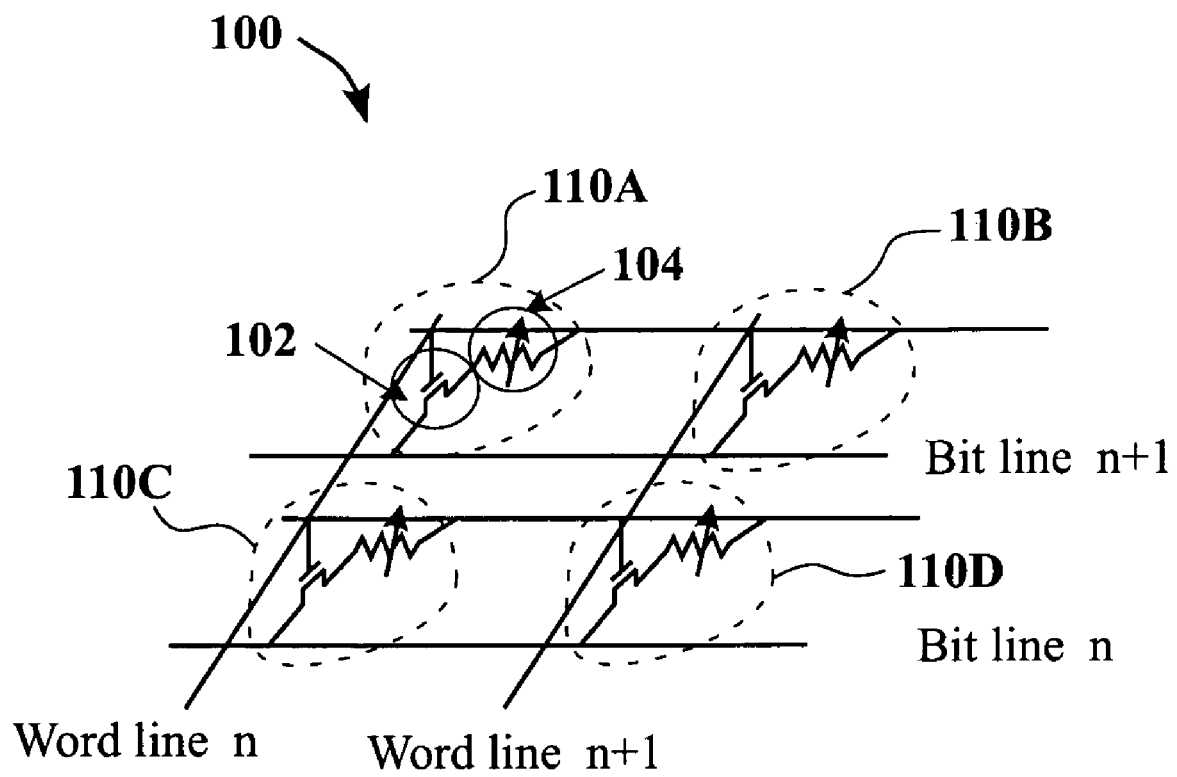
FIG. 1A shows a prior art phase change memory cell array.
Figure 1B:
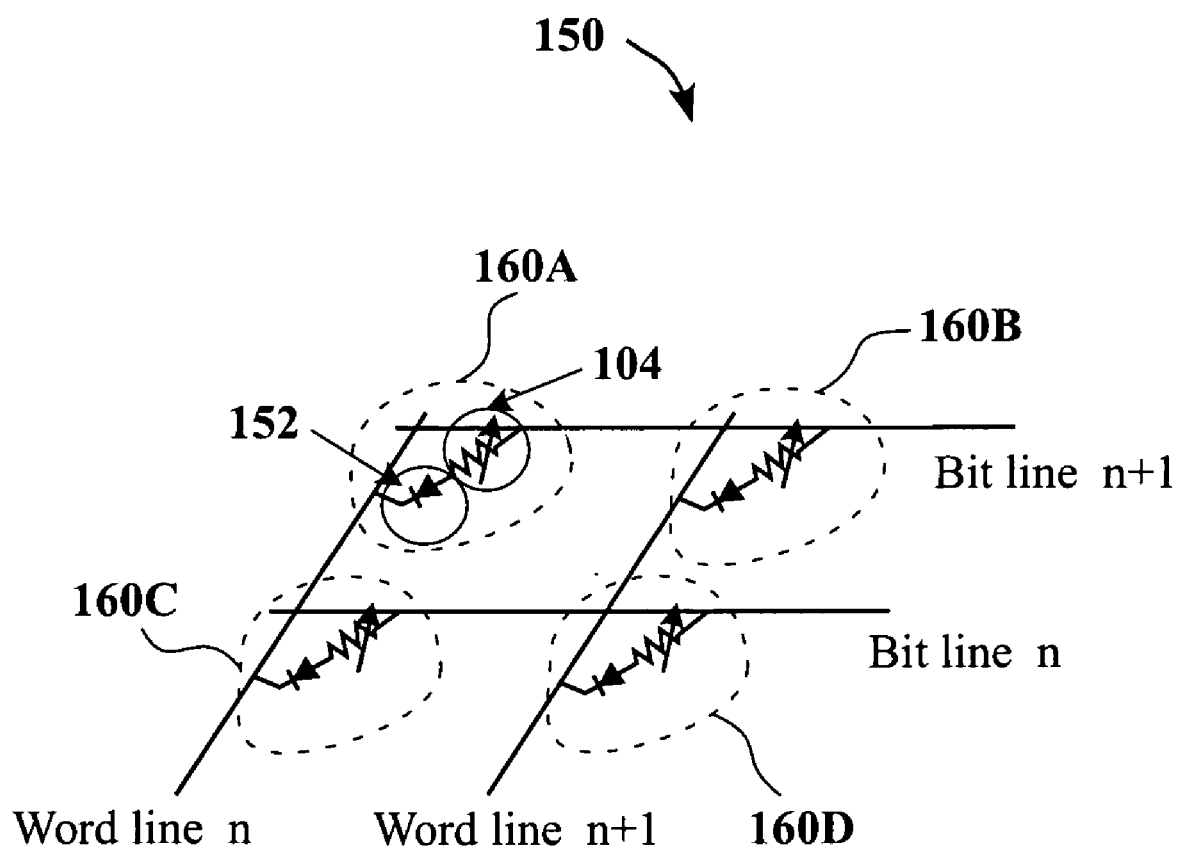
FIG. 1B shows another prior art phase change memory cell array.

As described above in FIGS. 1A and 1B, the prior art phase change memory cells required a steering element that can be either a transistor or a diode. However, due to the performance of the phase change device structure described herein, a single phase change device can be used as the memory cell without need of a separate steering element. However, it should be noted that a phase change memory cell formed with a small contact structure can be used with a separate steering element.

Figure 6:
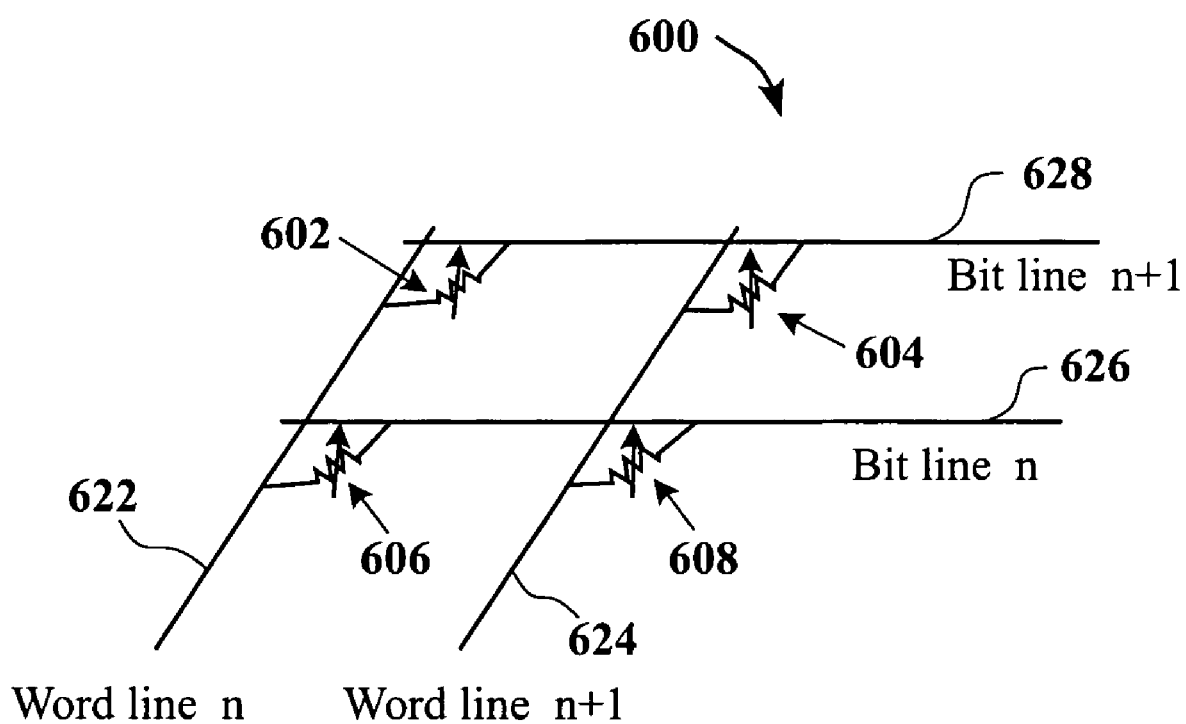
FIG. 6 shows an array of four phase change memory cells, in accordance with one embodiment of the present invention.

FIG. 6 shows an array 600 of four phase change memory cells, in accordance with one embodiment of the present invention. Each of the four phase change memory cells 602, 604, 606, and 608 includes a single phase change device coupled between the respective word lines 622 and 624 and bit lines 626 and 628. The array 600 is much simpler than the traditional designs. Due to the self-aligned structure of the phase change devices, the process flow can be very simple and the cell area can be minimized and the fabrication cost can be substantially reduced.

Figure 7:
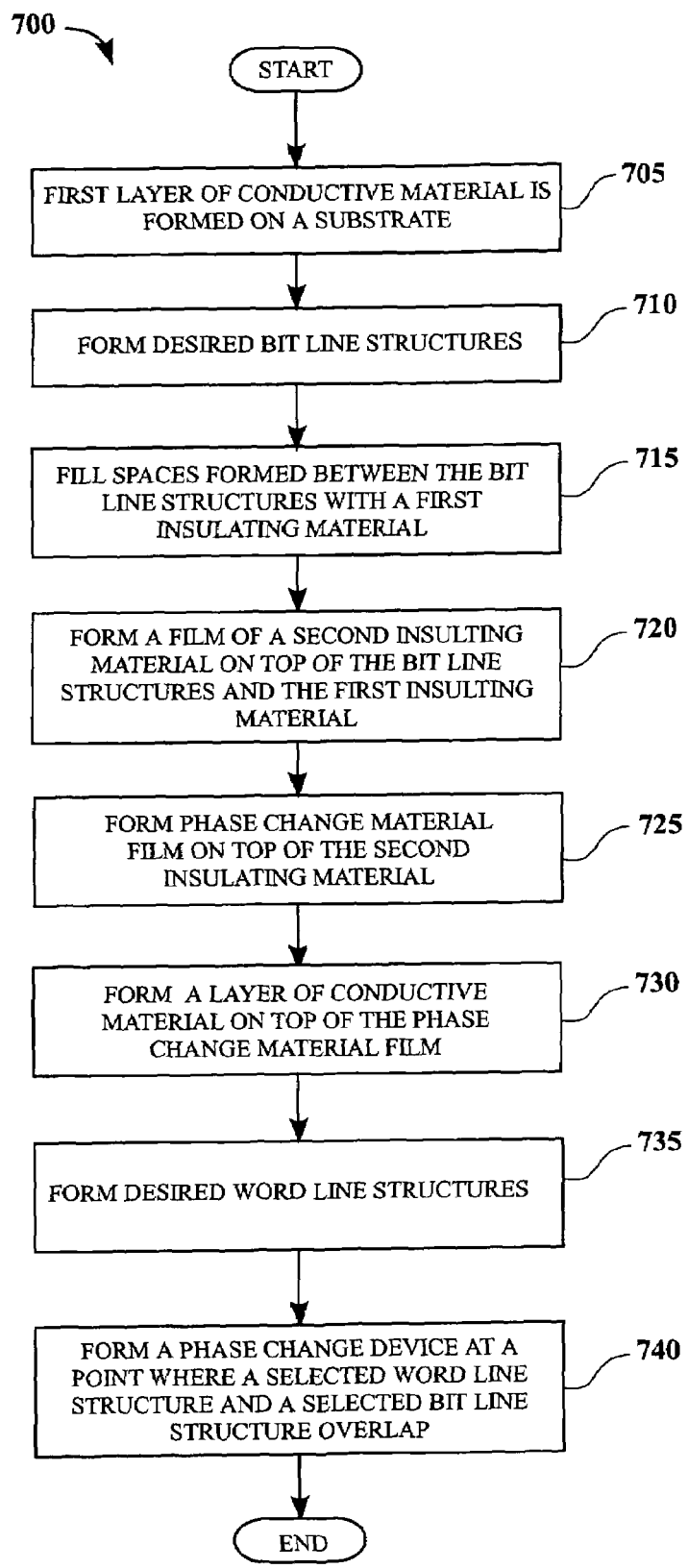
FIG. 7 is a flowchart of the method operations of constructing a phase change device, in accordance with one embodiment of the present invention.
Figure 8A:
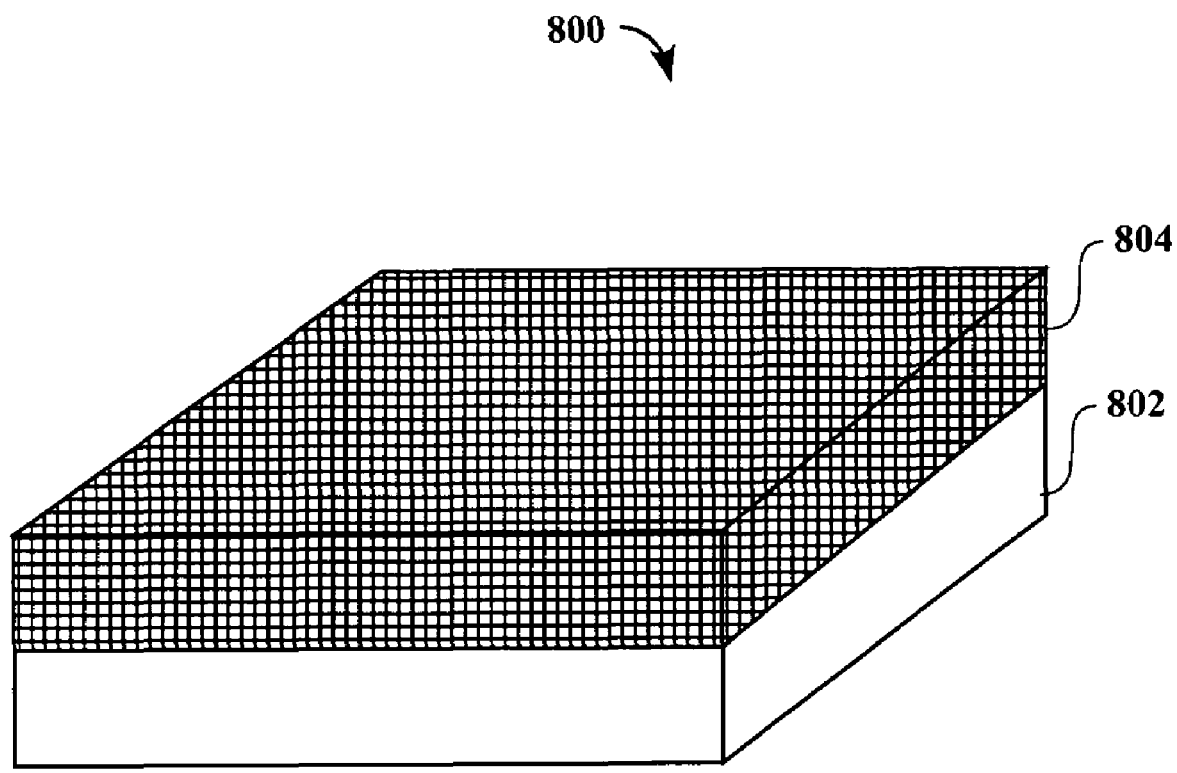
FIGS. 8A-8F show the phase change device construction stages, in accordance with one embodiment of the present invention.
Figure 8B:
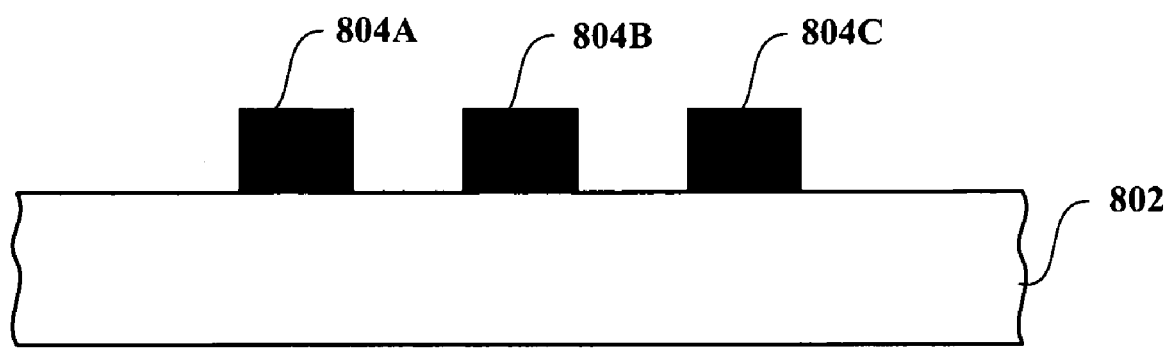

FIG. 7 is a flowchart of the method operations 700 of constructing a phase change device, in accordance with one embodiment of the present invention. FIGS. 8A-8F show the phase change device 800 construction stages, in accordance with one embodiment of the present invention. Referring now to FIGS. 7 and 8A, in an operation 705, a first layer of conductive material 804 is formed on a substrate 802. As shown in FIG. 8B, the first layer of conductive material 804 is patterned (i.e., masked and undesired material removed) to form the desired bit line structures 804A-804C, in an operation 710.

Figure 8C:
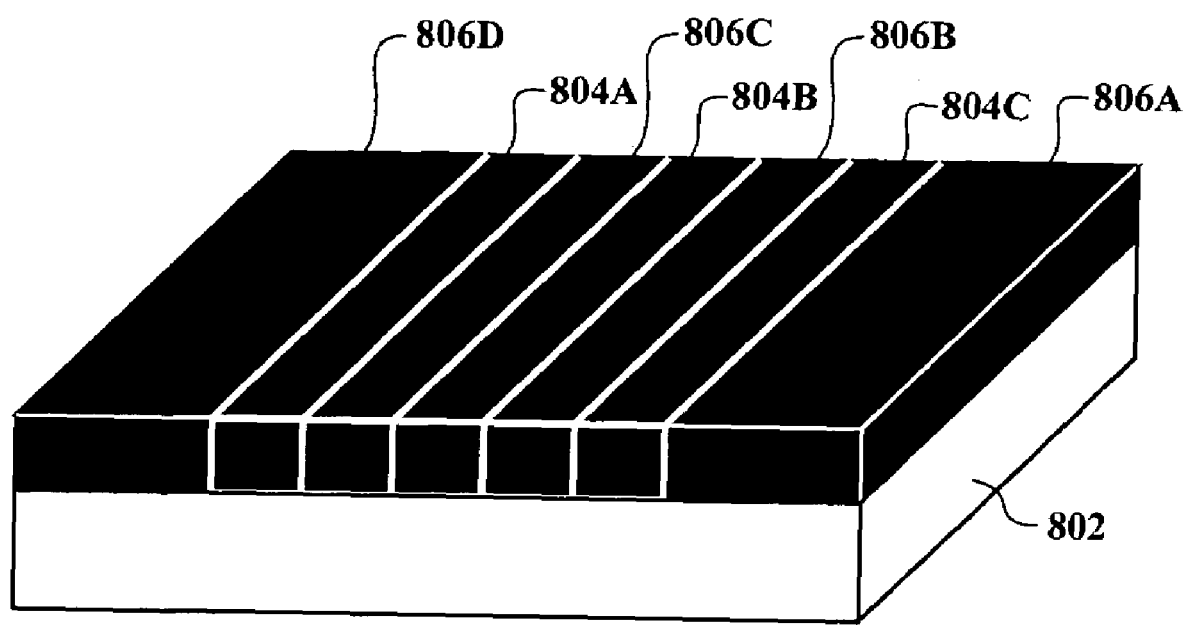
Figure 8D:
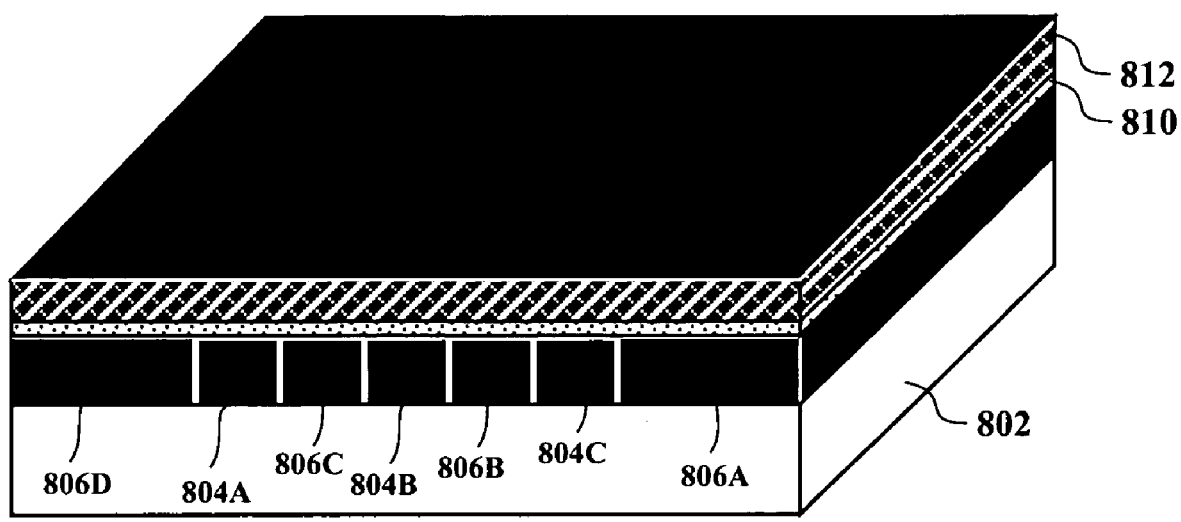

Referring now to FIGS. 7 and 8C, in an operation 715, a first insulating material 806A-806D (e.g., oxide) is filled into the spaces formed between the bit line structures 804A-804C. In an operation 720, a film of a second insulating material 810 is formed over the top of the bit line structures 804A-804C and the first insulating material 806A-806D, as shown in FIG. 8D. The second insulating material 810 can be the same or different material than the first insulating material 806A-806D.

Figure 8E:
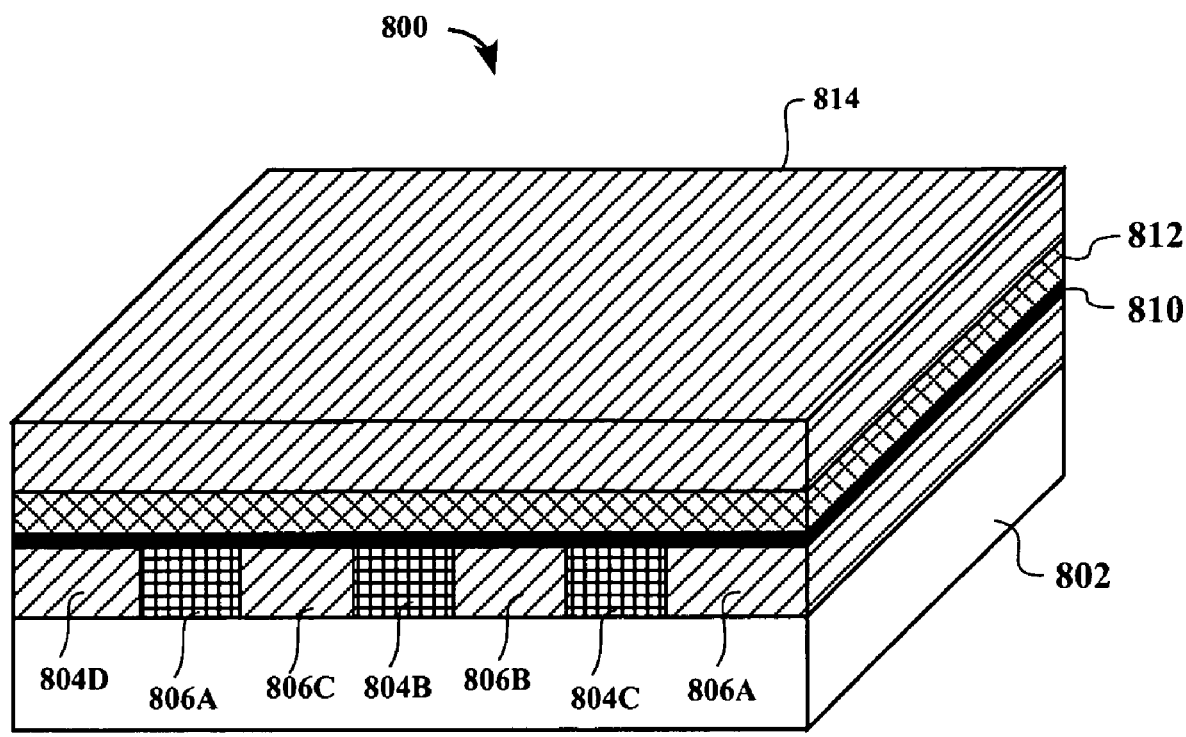

Referring now to FIGS. 7 and 8E, in an operation 725, a phase change material film 812 is formed on top of the second insulating material 810. In an operation 730, a second layer of conductive material 814 is formed on top of the phase change material film 812. The second layer of conductive material 814 and the bit line structures 804A-804C can be the same or different conductive materials. The first layer of conductive material 804 and second layer of conductive material 814 can be formed in any suitable method (e.g., sputtering or other deposition methods).

Figure 8F:
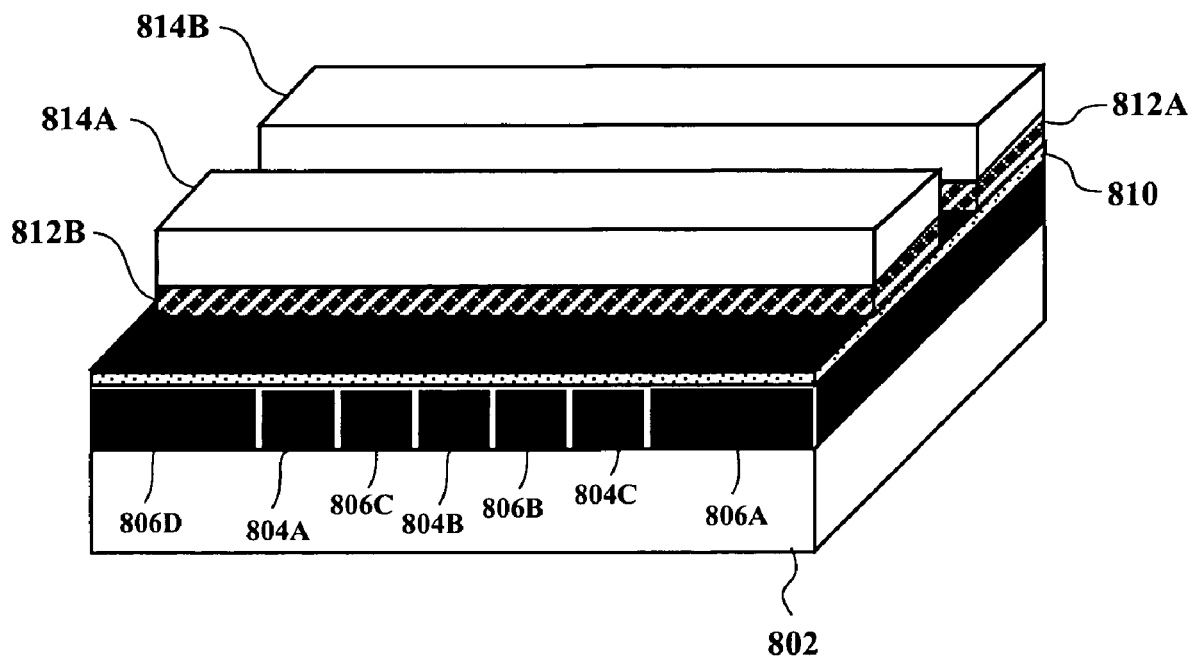

In an operation 735, the second layer of conductive material 814 and the phase change material film 812 are patterned (i.e., masked and undesired material removed) to form the desired word line structures 814A-814C, as shown in FIG. 8F. In an alternative embodiment, only the second layer of conductive material 814 may be patterned to form the desired word line structures 814A-814C.

The second insulating layer 810 between the bit line structures 804A-804C and the phase change material film 812 provides two functions: First, the second insulating layer 810 prevents an initial leakage current in a "fresh" crystallized phase change array. Second, the required small contact 302, as shown in FIG. 3 above, can be formed in an operation 740, by breaking down the insulator between the bit line structures 804A-804C and the word line structures 814A-814C. The insulator breakdown process can be used to form a phase change device at each point where the word line structures and the bit line structures overlap.

The simple self-aligned structure allows relatively easy scaling-down process. A very small overall memory cell size. The second insulating layer 810 provides additional insulation for non-programmed cells in one-time program products. The insulator breakdown process provides an ultra-small contact, thus reducing power consumption (i.e., power requirements to store and reset) and chip area.

As used herein in connection with the description of the invention, the term "about" means+/−10%. By way of example, the phrase "about 250" indicates a range of between 225 and 275. It will be further appreciated that the instructions represented by the operations in any of the figures described above are not required to be performed in the order illustrated, and that all the processing represented by the operations may not be necessary to practice the invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A phase change device comprising:
   a first contact electrode structure;
   a first insulating material formed on the first contact electrode structure;
   a phase change material formed on the first insulating material, the phase change material having a substantially uniform thickness;
   a second contact electrode structure formed on and in contact with the phase change material, wherein the phase change material and the first insulating material separate the first contact electrode structure and the second contact electrode structure at an overlap point; and
   a self-aligned contact structure formed in the first insulating material between the first contact electrode structure and the phase change material, wherein the self-aligned contact structure is formed by an insulating material breakdown process at the overlap point.

2. The device of claim 1, wherein the first insulating material is formed on top of the first contact electrode structure and the phase change material is formed on top of the first insulating material and the second contact electrode structure is formed on top of the phase change material.

3. The device of claim 1, wherein the phase change material formed on top of the first contact electrode structure and the first insulating material is formed on top of the phase change material and the second contact electrode structure is formed on top of the first insulating material.

4. The device of claim 1, wherein at least one of the first contact electrode structure or the second contact electrode structure includes multiple layers.

5. The device of claim 1, wherein the first contact electrode structure includes at least one of silicon, carbon, tungsten, copper, titanium, or titanium nitride.

6. The device of claim 1, wherein the second contact electrode structure includes at least one of silicon, carbon, tungsten, copper, titanium, or titanium nitride.

7. The device of claim 1, wherein the first insulating material includes an oxide.

8. The device of claim 1, wherein the first insulating material includes at least one of $SiO_2$, $Al_2O_3$, silicon nitride, or SiON.

9. The device of claim 1, further comprising a second insulating material formed around at least one of the first contact electrode or the second contact electrode structure.

10. The device of claim 9, wherein the second insulating material includes an oxide.

11. The device of claim 9, wherein the second insulating material includes at least one of $SiO_2$, $Al_2O_3$, silicon nitride, or SiON.

12. The device of claim 1, wherein the phase change material includes a chalcogenide material.

13. The device of claim 1, wherein the phase change material includes at least one of Te, Se, Sb, Ni, Ge, Ag and combinations thereof.

14. The device of claim 1, wherein the phase change material has a thickness of between about 1 nm and about 100 nm.

15. The device of claim 1, wherein the first contact electrode structure has a thickness of about 10 nm to about 1000 nm.

16. The device of claim 1, wherein the second contact electrode structure has a thickness of about 10 nm to about 1000 nm.

17. The device of claim 1, wherein the first insulating layer has a thickness of about 1 nm to about 30 nm.

18. The device of claim 1, wherein the contact has a size of between about 1 nm to about 1000 nm.

19. The device of claim 1, wherein the first contact electrode structure includes a plug structure.

20. The device of claim 1, wherein the second contact electrode structure includes a plug structure.

21. The device of claim 1, wherein the first contact electrode structure includes a bit line structure and wherein the second contact electrode structure includes a word line structure.

22. The device of claim 21, further comprising:
   a plurality of bit line structures and a plurality of word line structures arranged to form an array that includes a plurality of overlap points, wherein a layer of the first insulating material and a layer the phase change material separate each of the plurality of bit line structures and each of the plurality of bit line structures at each of the plurality of overlap points; and each one of the plurality of overlap points includes a corresponding one of a plurality of contact structures.

23. A phase change memory cell, comprising:
   a bit line structure;
   a first insulating material formed on top of the bit line structure;
   a phase change material formed on top of the first insulating material, the phase change material having a substantially uniform thickness;
   a word line structure formed on top of the phase change material, wherein the phase change material and the first insulating material separate the bit line structure and the word line structure at an overlap point; and
   a self-aligned contact structure formed in the first insulating material between the bit line structure and the phase change material at the overlap point, wherein the self-aligned contact structure is formed by an insulating material breakdown process.

24. A method of forming a phase change device, comprising:
   forming a sandwich structure including
      a first contact electrode structure;
      a layer of a first insulating material formed on the first contact electrode structure;
      a layer of a phase change material formed on the first insulating material, the layer of the phase change material having a substantially uniform thickness; and
      a second contact electrode structure formed on and in contact with the layer of the phase change material, wherein the phase change material and the first insulating material separate the first contact electrode structure and the second contact electrode structure at an overlap point; and
   forming a self-aligned contact structure through the first insulating material at a selected point where the first contact electrode structure and the second contact electrode structure overlap, wherein the self-aligned contact structure is formed by an insulating material breakdown process at the overlap point.

25. The method of claim 24, wherein forming the first contact electrode structure includes:
   forming a first conductive layer on a substrate;
   removing a portion of the first conductive layer to form the first contact electrode structure; and
   filling the removed portion of the first conductive layer with a second insulating material.

26. The method of claim 24, wherein forming the second contact electrode structure includes:
   forming a second conductive layer on top of the layer of the phase change material; and
   removing a portion of the second conductive layer to form the second contact electrode structure.

27. The method of claim 26, wherein removing the portion of the second conductive layer to form the second contact electrode structure includes removing a portion of the phase change material.

28. The method of claim 24, wherein the insulating material breakdown process includes applying at least one of a constant current, a constant voltage, a stepping current or a stepping voltage to the first contact electrode structure and the second contact electrode structure.

29. A phase change device comprising:
   a first contact electrode structure;
   a phase change material formed on top of the first contact electrode structure, the phase change material having a substantially uniform thickness;
   a first insulating material formed on top of the phase change material;
   a second contact electrode structure formed on top of the first insulating material, wherein the phase change material and the first insulating material separate the first contact electrode structure and the second contact electrode structure at an overlap point; and
   a self-aligned contact structure formed in the first insulating material between the second contact electrode structure and the phase change material, wherein the self-aligned contact structure is formed by an insulating material breakdown process at the overlap point.

* * * * *